(12) United States Patent
Chen et al.

(10) Patent No.: US 8,992,154 B2
(45) Date of Patent: Mar. 31, 2015

(54) STORAGE SYSTEM FOR GLASS SUBSTRATE AND METHOD FOR STORING GLASS SUBSTRATE

(75) Inventors: Zenghong Chen, Guandong (CN); Chunhao Wu, Guandong (CN); Kunhsien Lin, Guandong (CN); Xiande Li, Guandong (CN); Yongqiang Wang, Guandong (CN); Weibing Yang, Guandong (CN); Minghu Qi, Guandong (CN); Zhenhua Guo, Guandong (CN); Yunshao Jiang, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 162 days.

(21) Appl. No.: 13/634,880

(22) PCT Filed: Sep. 3, 2012

(86) PCT No.: PCT/CN2012/080903
§ 371 (c)(1),
(2), (4) Date: Sep. 14, 2012

(87) PCT Pub. No.: WO2014/032300
PCT Pub. Date: Mar. 6, 2014

(65) Prior Publication Data
US 2014/0064887 A1  Mar. 6, 2014

(30) Foreign Application Priority Data

Aug. 31, 2012 (CN) .......................... 2012 1 0316923

(51) Int. Cl.
*B65G 1/00* (2006.01)
*H01L 21/677* (2006.01)

(52) U.S. Cl.
CPC ......... *H01L 21/67769* (2013.01); *Y10S 414/14* (2013.01)
USPC ......... 414/279; 414/277; 414/940; 198/465.2

(58) Field of Classification Search
USPC ....................... 414/277, 279, 940; 198/465.2
See application file for complete search history.

(56) References Cited

U.S. PATENT DOCUMENTS

| | | | | |
|---|---|---|---|---|
| 2,277,309 | A * | 3/1942 | Doll | 198/465.2 |
| 5,928,077 | A * | 7/1999 | Kisakibaru | 454/187 |
| 5,955,857 | A * | 9/1999 | Kwon et al. | 318/568.11 |
| 6,280,134 | B1 * | 8/2001 | Nering | 414/217 |
| 6,308,818 | B1 * | 10/2001 | Bonora et al. | 198/465.1 |
| 6,877,944 | B2 * | 4/2005 | Peiter | 414/279 |
| 6,990,721 | B2 * | 1/2006 | Mariano et al. | 29/469 |
| 7,887,278 | B2 * | 2/2011 | Hoshino | 414/217.1 |
| 8,147,924 | B2 * | 4/2012 | Watanabe et al. | 427/532 |
| 8,554,643 | B2 * | 10/2013 | Kortelainen | 705/28 |
| 2003/0029696 | A1 * | 2/2003 | Hirata et al. | 198/358 |

(Continued)

*Primary Examiner* — Kaitlin Joerger
(74) *Attorney, Agent, or Firm* — Andrew C. Cheng

(57) ABSTRACT

The present invention discloses a storage system for glass substrate and also a method for storing a glass substrate. The storage system includes a rail system, a plurality of stockers, and a trolley. The rail system is configured with first and second interconnected loops of monorails. And a plurality of stockers is arranged adjacent to the rail system. A trolley is moveably arranged to travel along the first and second monorails of the rail system for transporting glass substrates between the stockers. Accordingly, the yield of the liquid crystal display panel can be increased, while the maintenance costs of the overhead shuttle can be lowered.

11 Claims, 2 Drawing Sheets

(56) References Cited

U.S. PATENT DOCUMENTS

2004/0126209 A1* 7/2004 Warhurst et al. .............. 414/279
2005/0036857 A1* 2/2005 Chen et al. .................... 414/279

* cited by examiner

STORAGE SYSTEM FOR GLASS SUBSTRATE AND METHOD FOR STORING GLASS SUBSTRATE

FIELD OF THE INVENTION

The present invention relates to a technology of automatic transportation of commodity, and more particularly to an automated storage system for glass substrate and also a method for storing a glass substrate.

BACKGROUND OF THE INVENTION

During the mass production of the liquid crystal display panels, a certain set of glass substrates is stored in an individual stocker or cartridge. Currently, each and every single liquid crystal display panel has to undergo a plurality of working procedures, while it has to be made in a large scale. As a result, a plurality of stockers is required. The glass substrates are frequently moved from one stocker to another stocker after it is performed with a certain working process. The transportation of the glass substrates is facilitated by an overhead shuttle (OHS). Sometimes, even the glass substrates between stockers with a comparably large distance are still moved frequently by overhead shuttle. Currently, the overhead shuttle is running on a monorail in a closed circuit. The overhead shuttle can only run toward a single direction. As a result, the performance and efficiency is poor, specially when the overhead shuttle is used to transport the glass substrates between stockers located distant from each other. Since the overhead shuttle can only run along a single direction, and travelling quite a long distance, the overall efficiency is limited, and the production of the liquid crystal display panel is also limited because of the comparably poor performance of the transportation of the glass substrate.

Accordingly, there is a necessity for a storage system for glass substrate, and also a method for storing the glass substrate so as to resolve the problem encountered by the prior art.

SUMMARY OF THE INVENTION

It is the primary objective of the present invention to provide a storage system for glass substrate, and also a method for storing the glass substrate so as to resolve the prior art technical issue. With the technical solution provided by the present invention, the performance of transportation of the glass substrates can be lifted, the yield of the liquid crystal display panel can be increased, and also reducing the maintenance fee of the overhead shuttle.

In order to resolve the technical issue encountered by the prior art, the present invention provides a technical solution by introducing a storage system for glass substrate which comprising a rail system configured with first and second interconnected loops of monorails, wherein the first and second monorails juxtaposed together to create a bidirectional area. A plurality of stockers is arranged adjacent to the rail system. And a trolley is moveably arranged on the first and second monorails for transporting glass substrates between the stockers, wherein the system further includes a cartridge for carrying the glass substrate, wherein the trolley moves the glass substrate between the stockers.

Wherein the stocker includes a pick-and-place unit, a displacing unit and a plurality of storage cells, each of the storage cells is used to store the cartridge, wherein the displacing unit is used to move the cartridge between the storage cells and the pick-and-place unit, wherein the cartridge is further moved between the pick-and-place unit and the trolley.

Wherein the pick-and-place device is arranged with rollers and the cartridge is moved between the pick-and-place device and the trolley.

Wherein the plurality of stockers are arranged on a perimeter of the rail system.

Wherein the trolley is an overhead trolley.

Wherein the trolley travels a shortest path between two selected stockers along the rail system.

In order to resolve the technical issue encountered by the prior art, the present invention provides a technical solution by introducing a storage system for glass substrate Which comprises a rail system configured with first and second interconnected loops of monorails. A plurality of stockers is arranged adjacent to the rail system. And a trolley is moveably arranged to travel along the first and second monorails of the rail system for transporting glass substrates between the stockers.

Wherein the system further includes a cartridge for carrying the glass substrate, wherein the trolley moves the glass substrate between the stockers.

Wherein the stocker includes a pick-and-place unit, a displacing unit, and a plurality of storage cells, each of the storage cells is used to store the cartridge, wherein the displacing unit is used to move the cartridge between the storage cells and the pick-and-place unit, wherein the cartridge is further moved between the pick-and-place unit and the trolley.

Wherein the pick-and-place device is arranged with rollers and the cartridge is moved between the pick-and-place device and the trolley.

Wherein the plurality of stockers are arranged on a perimeter of the rail system.

wherein the first and second monorails juxtaposed together to create a bidirectional area.

Wherein the trolley is an overhead trolley.

Wherein the trolley travels a shortest path between two selected stockers along the rail system.

In order to resolve the technical issue encountered by the prior art, the present invention provides a technical solution by introducing as method for storing a glass substrate which comprises the steps of a) selecting a shortest traveling path between two adjacent stockers along the rail system configured with first and second monorails; and b) moving a trolley with the selected and shortest path for moving the glass substrate between the stockers.

The present invention can be concluded with the following advantages. As compared to the existing prior art, with two interconnected monorail system, a trolley can travel with a shortest path therealong so as to increase the performance of the glass substrate. Accordingly, the yield of the liquid crystal display panel can be increased, while the maintenance costs of the overhead shuttle can be lowered.

DETAILED DESCRIPTION OF PREFERRED EMBODIMENT

Figure 1:
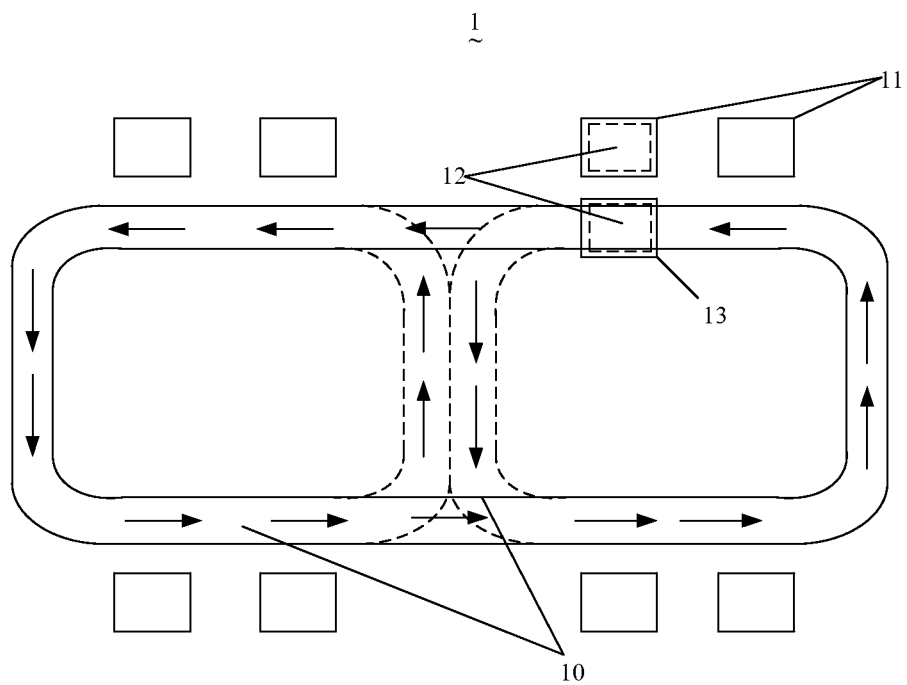
FIG. 1 is an illustrational and descriptive view of a storage system for glass substrate made in accordance with a preferable embodiment of the present invention.
Figure 2:
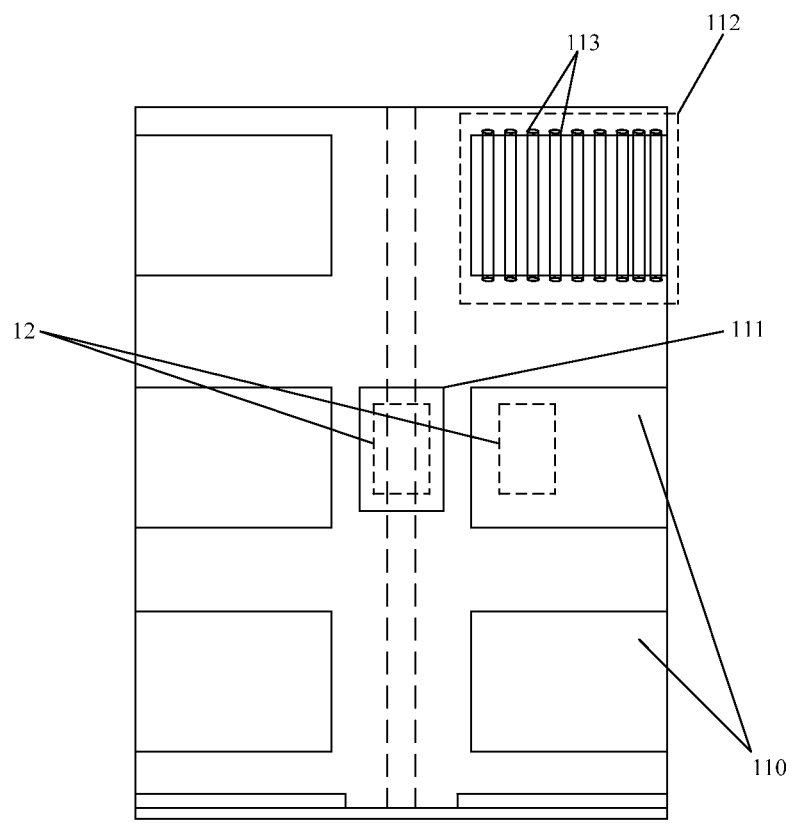
FIG. 2 is an illustrational and structural view of a stocker shown in FIG. 1.

Referring to FIGS. 1 and 2, and wherein FIG. 1 is an illustrational and descriptive view of a storage system for glass substrate made in accordance with a preferable embodiment of the present invention, and FIG. 2 is an illustrational and structural view of a stocker shown in FIG. 1. In the current embodiment, the storage system 1 includes a closed-loop rail system 10, a cartridge for glass substrate 12, a plurality of stockers 11, and a trolley 13.

In the current embodiment, the rail system 10 is configured with two monorails constructed into a loop. Of course, in other embodiment, the number of the monorails can be three or even more as depending to the field requirements. These two monorails are intended to run in unidirectional, and can be interconnected. Preferably, those two monorails are interconnected in their conjoining sections so as to construct a bidirectional zone. In addition, those two monorails of the rail system 10 are also in communication with each other. As shown in FIG. 1, those two monorails can construct a larger loop.

The cartridge 12 for glass substrate is used to carry the glass substrate. In the present embodiment, there is one cartridge 12, while in other embodiment, the number of the cartridge 12 can be two or even more.

The stockers 11 are preferably alternatively located around perimeter of the rail system 10. However, in other embodiment, the stockers 11 can be arranged within the rail system 10, i.e. internal of the monorail. Each of the stockers 11 includes a plurality of storage cells 110, a displacing unit 111 and a displacing unit 112. The storage cell 110 is used to store the glass substrate 12, and the displacing unit 111 is shuttled between the storage cell 110 and the displacing unit 112 to transfer the glass substrate. The pick-and-place unit 112 is provided with a plurality of rollers 113, and the glass substrate is moved by the roller 113 between the storage cell 110 and the trolley 13. In other embodiment, the cartridge 12 for glass substrate can be moved between the displacing 112 and the trolley 13 with other measurement. The pick-and-place 112 can be arranged and located adjacent to the rail system 10 such that the cartridge 12 for glass substrate can be readily displaced between the pick-and-place 112 and the trolley 13.

In the current embodiment, the trolley 12 can be an overhead shuttle. As shown in FIG. 13, the trolley 13 is moveably arranged onto the rail system 10, and runs through the rail system 10, alternatively move between the first and second monorails. As a result, the cartridge 12 can be readily moved between the stockers 11. The trolley 13 is moved unidirectional along the rail system 10 as marked by the arrow.

The trolley 13 will travel with a selected and shortest path between the two stockers 11 along the rail system 10. The shortest path is selected by controlling and managing software of the trolley 13.

Figure 3:
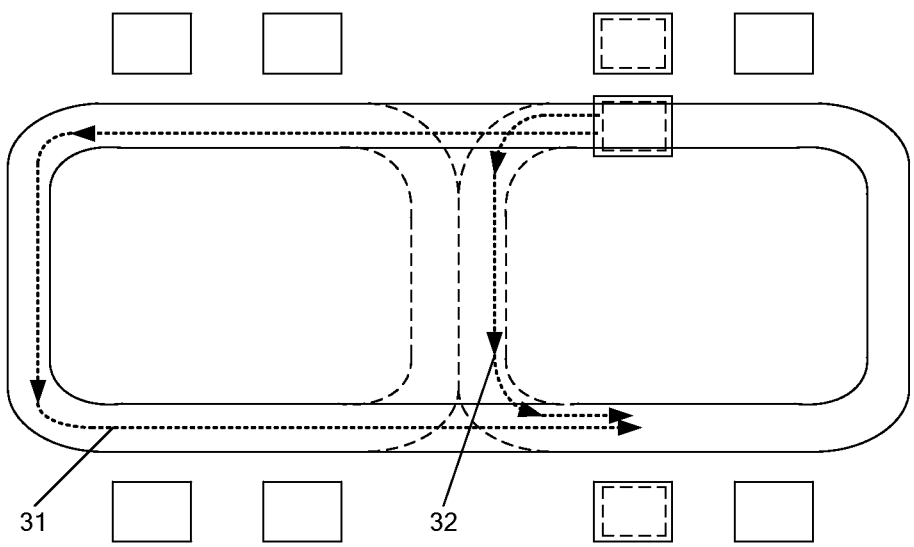
FIG. 3 is an illustrational view of a shortest traveling path of the storage system for glass substrate.

Substantially and please referring to FIG. 3 and which is an illustrational view of a shortest traveling path of the storage system for glass substrate. When the trolley 13 is required to transfer the cartridge 12 between two stockers 11 which are located on opposite sides of the rail system 10, then there are three routes on which the trolley 13 can travel, i.e. routes 31 and route 32. The software of the trolley 13 will take the shortest path, i.e. route 32 to transfer the cartridge.

Figure 4:
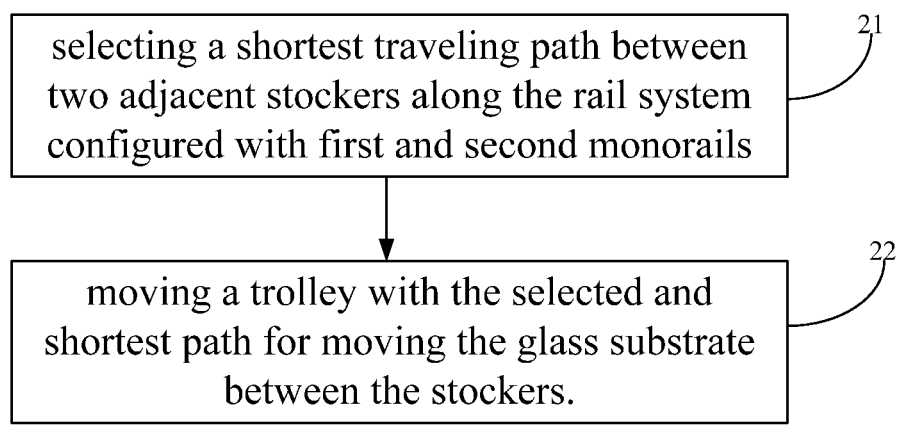
FIG. 4 is a flow diagram of a storing method for glass substrate made in accordance with the present invention.

Referring to FIG. 4, which is a flow diagram of a storing method for glass substrate made in accordance with the present invention. The method of storing a glass substrate includes the steps of the following:

Step 21: selecting a shortest traveling path between two adjacent stockers along the rail system 10 configured with first and second monorails.

Step 22: moving a trolley with the selected and shortest path for moving the glass substrate between the stockers.

In steps 21 and 22, when the stockers are located at longitudinal ends of the rail system 10, the trolley will travel a selected and shortest path.

As compared to the existing prior art, with two interconnected monorail system, a trolley can travel with a shortest path therealong so as to increase the performance of the glass substrate. Accordingly, the yield of the liquid crystal display panel can be increased, while the maintenance costs of the overhead shuttle call be lowered.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A storage system for glass substrate, comprising:
a rail system configured with first and second interconnected loops of monorails, wherein the first and second monorails juxtaposed together to create a bidirectional area;
a plurality of stockers arranged adjacent to the rail system; and
a trolley moveably arranged on the first and second monorails for transporting glass substrates between the stockers, wherein the system further includes a cartridge for carrying the glass substrate, wherein the trolley moves the glass substrate between the stockers,
wherein the trolley is movable in a first predetermined direction along the first loop of monorail and is also movable in a second predetermined direction along the second loop of monorail, whereby the first and second predetermined directions are opposite to each other in the bidirectional area so that the movement of the trolley along the first and second loops in the bidirectional area is in opposite directions respectively, otherwise the first and second predetermined directions are consistent with each other so that the movement of the trolley along the first and second loops is in an identical direction to allow the trolley to travel a shortest path between two selected stockers selected among the first loop, the second loop, and a combination of the first and second loops interconnected through the bidirectional area.

2. The storage system as recited in claim 1, wherein the stocker includes a pick-and-place unit, a displacing unit, and a plurality of storage cells, each of the storage cells is used to store the cartridge, wherein the displacing unit is used to move the cartridge between the storage cells and the pick-and-place unit, wherein the cartridge is further moved between the pick-and-place unit and the trolley.

3. The storage system as recited in claim 2, wherein the pick-and-place device is arranged with rollers and the cartridge is moved between the pick-and-place device and the trolley.

4. The storage system as recited in claim 1, wherein the plurality of stockers is arranged on a perimeter of the rail system.

5. The storage system as recited in claim 1, wherein the trolley is an overhead trolley.

6. A storage system for glass substrate, comprising:
a rail system configured with first and second interconnected loops of monorails;
a plurality of stockers arranged adjacent to the rail system; and
a trolley moveably arranged to travel along the first and second monorails of the rail system for transporting glass substrates between the stockers,
wherein the first and second monorails juxtaposed together to create a bidirectional area, and
wherein the trolley is movable in a first predetermined direction along the first loop of monorail and is also movable in a second predetermined direction along the second loop of monorail, whereby the first and second predetermined directions are opposite to each other in the bidirectional area so that the movement of the trolley along the first and second loops in the bidirectional area is in opposite directions respectively, otherwise the first and second predetermined directions are consistent with each other so that the movement of the trolley along the first and second loops is in an identical direction to allow the trolley to travel a shortest path between two selected stockers selected among the first loop, the second loop, and a combination of the first and second loops interconnected through the bidirectional area.

7. The storage system as recited in claim 6, wherein the system further includes a cartridge for carrying the glass substrate, wherein the trolley moves the glass substrate between the stockers.

8. The storage system as recited in claim 7, wherein the stocker includes a pick-and-place unit, a displacing unit, and a plurality of storage cells, each of the storage cells is used to store the cartridge, wherein the displacing unit is used to move the cartridge between the storage cells and the pick-and-place unit, wherein the cartridge is further moved between the pick-and-place unit and the trolley.

9. The storage system as recited in claim 8, wherein the pick-and-place device is arranged with rollers and the cartridge is moved between the pick-and-place device and the trolley.

10. The storage system as recited in claim 6, wherein the plurality of stockers are arranged on a perimeter of the rail system.

11. The storage system as recited in claim 6, wherein the trolley is an overhead trolley.

* * * * *